United States Patent
Jensen

(10) Patent No.: US 12,069,433 B2
(45) Date of Patent: Aug. 20, 2024

(54) METHOD OF OPERATING A HEARING ASSISTIVE DEVICE HAVING A RECHARGEABLE BATTERY

(71) Applicant: Widex A/S, Lynge (DK)

(72) Inventor: Brian Lomholt Jensen, Frederikssund (DK)

(73) Assignee: Widex A/S, Lynge (DK)

( * ) Notice: Subject to any disclaimer, the term of this patent is extended or adjusted under 35 U.S.C. 154(b) by 114 days.

(21) Appl. No.: 17/778,490

(22) PCT Filed: Oct. 25, 2020

(86) PCT No.: PCT/EP2020/079978
§ 371 (c)(1),
(2) Date: May 20, 2022

(87) PCT Pub. No.: WO2021/099062
PCT Pub. Date: May 27, 2021

(65) Prior Publication Data
US 2022/0417676 A1    Dec. 29, 2022

(51) Int. Cl.
*H04R 25/00*    (2006.01)
*G01R 31/367*    (2019.01)
*G01R 31/392*    (2019.01)

(52) U.S. Cl.
CPC ......... *H04R 25/305* (2013.01); *G01R 31/367* (2019.01); *G01R 31/392* (2019.01);
(Continued)

(58) Field of Classification Search
CPC ................ H04R 25/305; H04R 25/554; H04R 2225/31; H04R 2225/33; H04R 2225/61;
(Continued)

(56) References Cited

U.S. PATENT DOCUMENTS 5,844,884 A    12/1998 Szlenski
9,467,771 B2 *    10/2016 Eckardt ................ H04R 1/1091
(Continued)

FOREIGN PATENT DOCUMENTS

EP    2 293 599 A1    3/2011
EP    3 537 730 A1    9/2019
(Continued)

OTHER PUBLICATIONS

International Search Report for PCT/EP2020/079978 dated Jan. 29, 2021 [PCT/ISA/210].
(Continued)

*Primary Examiner* — Angelica M McKinney
(74) *Attorney, Agent, or Firm* — Sughrue Mion, PLLC

(57) ABSTRACT

A method of operating a hearing assistive device having a rechargeable battery, and comprises reading battery status data from a battery controller during use of the hearing assistive device, transferring the battery status data wirelessly from the hearing assistive device to a computing device and predicting, in the computing device, a remaining battery time for the rechargeable battery based upon the battery status data received. Once the remaining battery time is predicted, it is compared with a predefined use pattern for hearing assistive device and a user becomes notified if a conflict between the remaining battery time and the predefined use pattern is observed.

14 Claims, 3 Drawing Sheets

(52) U.S. Cl.
CPC ....... *H04R 25/554* (2013.01); *H04R 2225/31* (2013.01); *H04R 2225/33* (2013.01)

(58) Field of Classification Search
CPC .............. H04R 25/552; H04R 2460/03; H04R 25/558; G01R 31/367; G01R 31/392; H02J 7/0047; H02J 7/00306; H02J 7/0049; H02J 7/0048
See application file for complete search history.

(56) References Cited

U.S. PATENT DOCUMENTS

| | | | |
|---|---|---|---|
| 9,882,404 B2* | 1/2018 | Park | H02J 7/0063 |
| 9,913,050 B2* | 3/2018 | Goorevich | H04R 25/30 |
| 2009/0076804 A1 | 3/2009 | Bradford et al. | |
| 2010/0262392 A1* | 10/2010 | Murphy | G06F 3/0625 |
| | | | 702/63 |
| 2013/0195295 A1 | 8/2013 | Van Halteren et al. | |
| 2016/0183009 A1* | 6/2016 | Kim | H04R 25/558 |
| | | | 381/315 |
| 2017/0164120 A1* | 6/2017 | Johansen | H02J 7/00034 |
| 2017/0215010 A1* | 7/2017 | Lineaweaver | H04R 25/305 |
| 2018/0014073 A1* | 1/2018 | Al-Shaykh | H04L 12/281 |
| 2018/0271710 A1 | 9/2018 | Boesen et al. | |
| 2022/0272461 A1* | 8/2022 | Bisgaard | H04R 25/30 |
| 2023/0396935 A1* | 12/2023 | Sturgeon | G01R 31/3835 |

FOREIGN PATENT DOCUMENTS

| | | |
|---|---|---|
| WO | 2011/159349 A1 | 12/2011 |
| WO | 2013/107507 A1 | 7/2013 |
| WO | 2017/103896 A1 | 6/2017 |

OTHER PUBLICATIONS

Written Opinion for PCT/EP2020/079978 dated Jan. 29, 2021 [PCT/ISA/237].
Danish Search Report for PA 2019 01359 dated May 6, 2020.

* cited by examiner

METHOD OF OPERATING A HEARING ASSISTIVE DEVICE HAVING A RECHARGEABLE BATTERY

CROSS REFERENCE TO RELATED APPLICATIONS

This application is a National Stage of International Application No. PCT/EP2020/079978 filed Oct. 25, 2020, claiming priority based on U.S. Patent Application No. 62/938,526 filed Nov. 21, 2019, the entirety of their content incorporated herein.

The present invention relates to a hearing system including a computing device and at least one hearing assistive device having a rechargeable battery.

The capacity of hearing aid batteries remains stable, but use cases, like audio streaming via Bluetooth, involves increased power consumption. In order to handle the increased power consumption, the hearing aid business has started a transition to rechargeable batteries. Most hearing aid users are using their hearing aids all the time from early morning till late evening. Often a hearing aid issues an acoustic warning signal when the battery is close to being discharged.

Computers and smartphones can calculate remaining battery time for own batteries. U.S. Pat. No. 5,844,884 A discloses a method of predicting remaining battery capacity based upon a discharging algorithm.

The purpose of the invention is to provide a method of operating a hearing assistive device having a rechargeable battery in a way so the hearing aid user can rely on being able to use the hearing assistive device for an entire day.

This method of operating a hearing assistive device having a rechargeable battery, and comprising reading battery status data from a battery controller during use of the hearing assistive device; transferring the battery status data wirelessly from the hearing assistive device to a computing device; predicting, in the computing device, a remaining battery time for the rechargeable battery based upon the battery status data received; comparing the remaining battery time with a predefined use pattern for hearing assistive device; and notifying a user when a conflict between the remaining battery time and the predefined use pattern is observed. The invention is defined in claims 1 and 5. Preferred embodiments are defined in the dependents claims.

The invention will be described in further detail with reference to preferred aspects and the accompanying drawing, in which.

DETAILED DESCRIPTION

Figure 1:
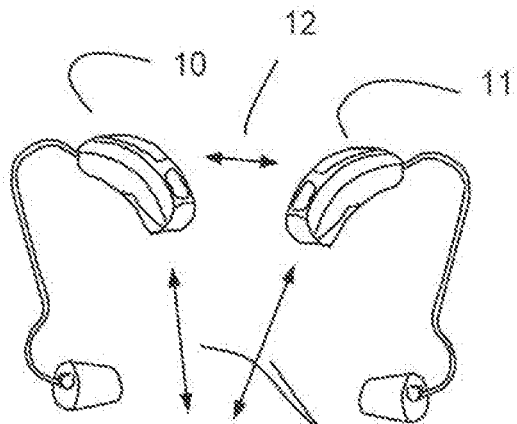
FIG. 1 illustrates schematically a hearing aid system according to one embodiment of the invention.

FIG. 1 illustrates schematically a hearing aid system according to one embodiment of the invention. The hearing aid system comprises two hearing aids 10, 11 and a personal communication device 13. The two hearing aids 10, 11 can communicate via an inter-ear communication path 12, and each of the two hearing aids 10, 11 are able to communicate with the personal communication device 13 via two wireless connections 14. In one embodiment, the inter-ear communication path 12 is provided by means of respective magnetic induction radios present in the two hearing aids 10, 11. The wireless connections 14 is provided by short-range radios included in the two hearing aids 10, 11 for communication with the personal communication device 13, e.g. being a smartphone. The short-range radios may in one embodiment operate according to a radio protocol being compliant with a Bluetooth standard. In one embodiment, the inter-ear communication path 12 and the wireless connection 14 are based on the same radio protocol preferably being compliant with a Bluetooth standard.

The inter-ear communication path 12 has a primary purpose to exchange data between the two hearing aids 10, 11 for providing the hearing-impaired user binaural hearing for determining the direction and origin of sounds. This requires exchange of frequency cues.

The wireless connections 14 have several purposes, including allowing the personal communication device 13 to operate as remote control for the two hearing aids 10, 11, or for transporting settings to the hearing aids 10, 11 during a programming session via the internet. One further purpose may be streaming audio from the personal communication device 13 to the two hearing aids 10, 11, e.g. during phone calls, when viewing videos on the personal communication device 13, or when listing to music from a streaming service.

Figure 3:
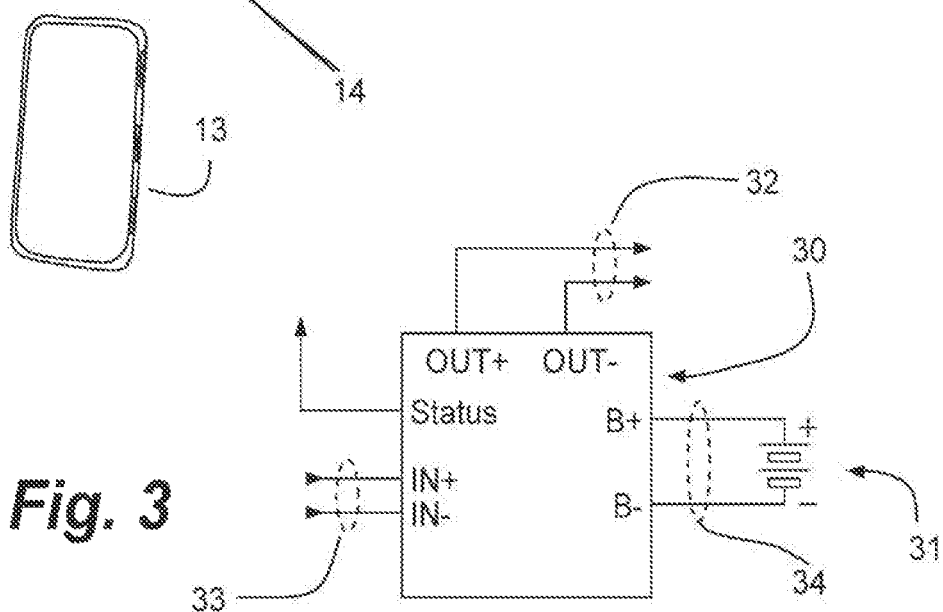
FIG. 3 illustrates schematically a battery controller according to one embodiment of the invention controlling the charging and discharging of a rechargeable battery.

FIG. 3 illustrates schematically a battery controller 30 adapted for controlling the charging and discharging of a rechargeable battery 31. The battery controller 30 is integrated in a hearing assistive device, e.g. the hearing aids 10, 11. In one embodiment, the battery controller 30 operates with 5V which can be provided by a USB mini cable that is commonly used for charging smartphone. The voltage is delivered via a not shown charging stand to a set of conductive paths or wires 33 to the input terminals IN+ and IN− of the battery controller 30. When the input terminals IN+ and IN− are powered, the hearing assistive device will be in charging state. The +5V should be connected to IN+ and the IN− terminal provides ground of the +5V supply.

The rechargeable battery 31 is in one embodiment a lithium-ion. The rechargeable battery 31 is via a set of conductive paths or wires 34 connected with the positive terminal to a B+ pin of the battery controller 30, while the negative terminal is connected to a B− pin of the battery controller 30. The battery controller 30 acts as a module for controlling the charging and discharging of the rechargeable battery 31, and therefor also for controlling the power supply to the hearing aids 10, 11. By being careful with the pin connections, it is possible to omit a reverse polarity protection.

In charging state (50 in FIG. 5), the voltage present on the input pins IN+ and IN− will be passed to the battery pins B+ and B−. The charging process is controlled by the battery controller 30. The charging current of the battery controller 30 depends on size of the battery 31, and in one embodiment the charging current will be significantly below 1 A, it can be controlled by adjusting a resistor internally in the battery controller 30. When the battery controller 30 has charged the rechargeable battery 31 completely, it will preferably automatically stop charging. The not shown charging stand will then communicate, e.g. by turning a LED on to the user, that the charging has been completed. The battery controller 30 will then leave charging state and may enter a normal use state (51 in FIG. 5). By leaving the charging state, the battery controller 30 will disconnect the input terminals IN+ and IN− from the battery pins B+ and B−.

The battery management system shown in FIG. 3 manages the rechargeable battery 31, such as ensuring that the battery 31 operates inside its recommended operating state, calculating secondary data, reporting that data, controlling and authenticating the relevant environment including charging stand. In one embodiment, the battery controller 30 includes, either integrated or associated, a Coulomb counter for monitoring the charge delivered from the battery 31.

In normal use state, the rechargeable battery 31 will power the electronics of the hearing assistive device. Two output pins OUT+ and OUT− are connected to the circuit to be powered by the rechargeable battery 31 via a pair of conducting paths or wires 32. The OUT+ pin the outputs the positive voltage from the rechargeable battery 31, and the OUT− pin outputs the negative voltage and should be connected to the ground of circuit which has to be powered by the rechargeable battery 31.

The battery controller 30 will monitor the voltage of the rechargeable battery 31 as it powers the electronics of the hearing aids 10, 11 via the wires 32. The battery controller 30 has a status output from where it is possible to tap parameters available in the battery controller 30. These parameters may include one or more of the following parameters: the battery voltage available from the rechargeable battery 31, the current drain from the rechargeable battery 31, and the temperature of the battery/electronics, and or a prediction for the remaining time before the rechargeable battery 31 will reach the critical value 21 based upon the current battery voltage and the current power consumption of the electronics.

Figure 2:
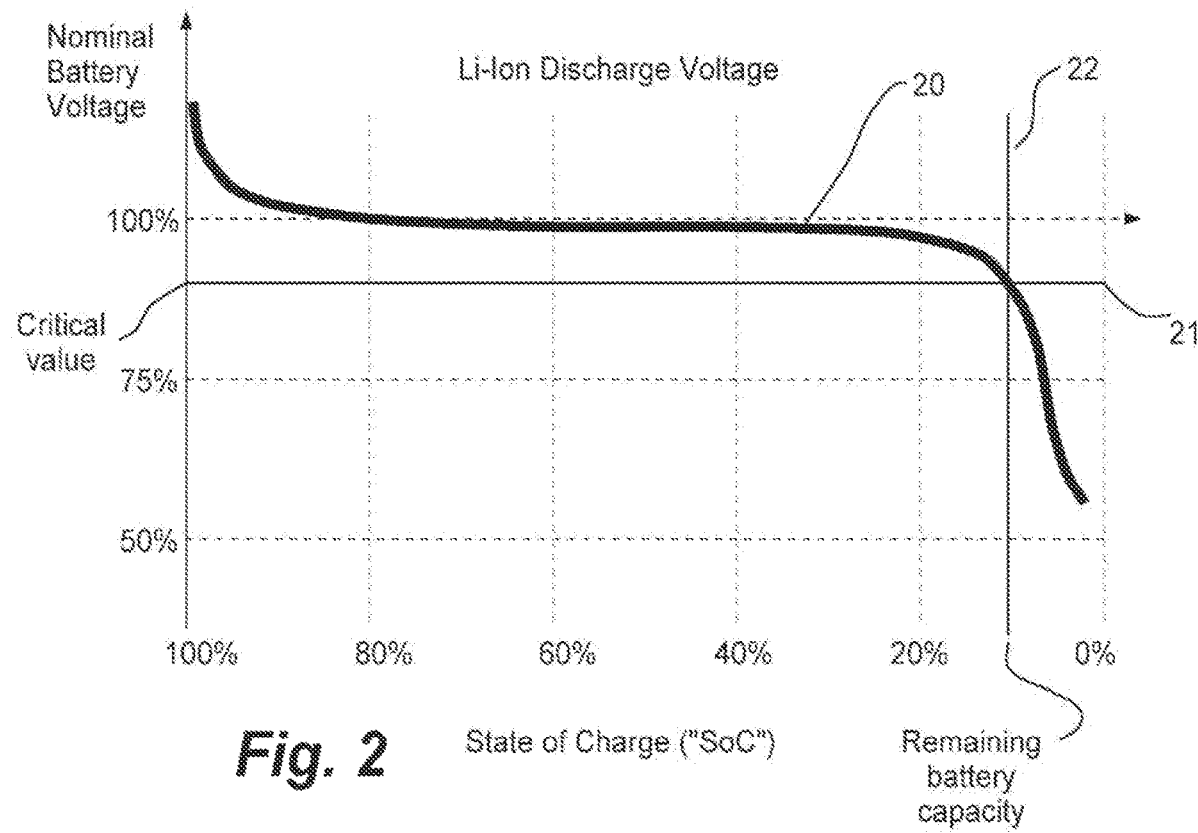
FIG. 2 illustrate the discharging curve for a rechargeable battery.

FIG. 2 illustrate the discharging curve for a rechargeable battery 31, such as a lithium-ion battery. It is seen that the rechargeable battery 31 when fully charged, will deliver a battery voltage 20 (the bold curve) slightly above the nominal battery voltage value (100%) for a short while. Over time, the rechargeable battery 31 will change from a 100% state of charge condition towards a 0% state of state of charge condition due to the load originating from the electronics of the hearing aids 10, 11.

It is seen that the battery voltage 20 delivered from the rechargeable battery 31 remains stable around the nominal battery voltage from an almost recharged battery to an almost discharged battery. It is seen that the battery voltage 20 starts dropping when approximately 20% state of charge is left. The battery controller 30 monitors the battery voltage 20, and when a threshold or a critical value, e.g. around 90% of the nominal battery voltage, is reached, battery controller 30 will automatically disconnect the rechargeable battery 31 from the load and protect the rechargeable battery 31 from over-discharging. Protecting the rechargeable battery 31 from a full discharge, will increase the lifetime for the cells of the rechargeable battery 31.

Figure 4:
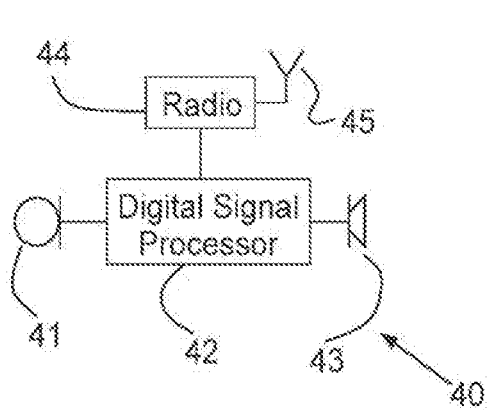
FIG. 4 illustrates schematically the major electronic components of a hearing aid according to one embodiment of the invention.

FIG. 4 illustrates schematically the major electronic components of a hearing aid 40 according to one embodiment of the invention. The hearing aid 40 has at least one input transducer or microphone 41 picking up an audio signal. The audio signal is digitized and fed to digital signal processor 42 adapted for amplifying and conditioning of the audio signal intended to become presented for the hearing aid user. The amplification and conditioning are carried out according to a predetermined setting stored in the hearing aid 40 to alleviate a hearing loss by amplifying sound at frequencies in those parts of the audible frequency range where the user suffers a hearing deficit. The amplified and conditioned audio signal is reproduced for the user via a receiver or speaker 43. The microphone 41, digital signal processor 42, and speaker 43 provides an audio signal path with hearing loss alleviation.

Furthermore, the hearing aid 40 includes a radio 44 and antenna 45. The radio may be used for inter-ear communication as indicated with in FIG. 1, or for communication with at remote device, such as the smartphone 13 via the communication path 14 as shown in FIG. 1. The hearing aid wearer can stream audio from the smartphone 13 directly to the hearing aids 10, 11 via a Bluetooth protocol. The audio streaming makes it possible to stream audio from a telephone call directly from the smartphone 13 directly to the hearing aids 10, 11. Furthermore the audio streaming may also include streaming of entertainment audio as music, audio track from videoclips, pod casts etc. In general, the audio streaming is significantly more power consuming compared to the traditional hearing aid operation. Therefor the hearing aid user may risk draining the batteries on audio streaming so the hearing aid operation can not be maintained the full day without interruption. The digital signal processor 42 is furthermore adapted for reading status data from the battery controller 30 and forwarding the read data to the radio 45 and further to the computing device 13 via the wireless communication link 14.

Figure 5:
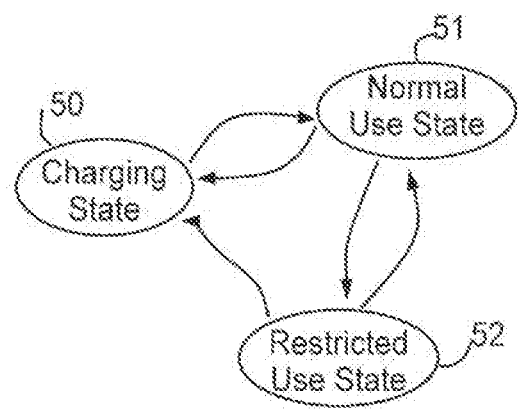
FIG. 5 illustrates schematically a state diagram for a hearing aid according to one embodiment of the invention.

FIG. 5 illustrates schematically a state diagram for a hearing aid 40 according to one embodiment of the invention. The hearing aid 40 may have sensors detecting when the hearing aid 40 is placed in a not-shown charging stand, and when the battery controller 30 starts charging the rechargeable battery 31, either via a galvanic connection or a wireless connection to the external power supply, the hearing aid 40 assumes the charging state 50 where no power in the illustrated embodiment is delivered to the electronics of the hearing aid 40 via the wires 32.

When the hearing aid 40 is removed from the charging stand or the battery controller 30 deems the rechargeable battery 31 to be fully charged, the hearing aid 40 is ready for use and assumes a normal use state 51. Here the user is offered the full range of hearing aid services including basic hearing aid functionality where the speaker 43 amplifies the environmental sounds picked up by the microphone 41. The full range of hearing aid services does include using the wireless connections 14 for exchanging control signals allowing the personal communication device 13 to operate as remote control for the two hearing aids 10, 11, and for streaming audio from the personal communication device 13 to the two hearing aids 10, 11, e.g. during phone calls, when viewing videos on the personal communication device 13, or when listing to music from a streaming service.

As the audio streaming using the wireless connections 14 is using significantly more power than the basic hearing aid functionality, the audio streaming will affect the time remaining before recharging is due. Using audio streaming heavily, the user may risk that the time remaining before recharging is due does not match the anticipated use. In this case the hearing aid must be recharged, and during the recharging the hearing aid user cannot use his hearing aids. According to one aspect of the invention there is provided a restricted use state 52 offering the basic hearing aid functionality where the speaker 43 amplifies the environmental sounds picked up by the microphone 41, and the use of the personal communication device 13 as remote control for the two hearing aids 10, 11 by allowing exchange of control signals via the wireless connections 14.

When the hearing aid app based on the data received from the battery controller 30 deems that the rechargeable battery 31 will have difficulties in fulfilling the requirements for the anticipated use, it forces, in one embodiment of the invention, the hearing aids 10, 11 into the restricted use state 52. In some embodiments, the hearing aid user may force the hearing aids 10, 11 to re-enter the normal use state 51, if he feels that the audio streaming justifies the higher power consumption, and consequently the reduced time before recharging is required.

Figure 6:
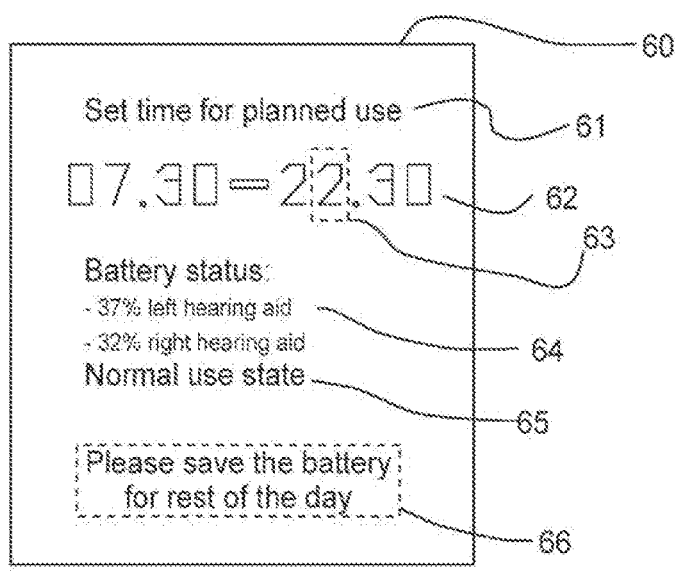
FIG. 6 illustrates a display view for the personal communication device.

FIG. 6 illustrates a display view 60 for a hearing aid app on a smartphone, such as the personal communication device 13. The display view 60 has a header 61 indicating the purpose of the display view 60, namely for setting the time for planned use—here marked as a time range 62 from 7.30 to 22.30. The user may operate of the data by touching a number, whereby the number becomes editable as marked with the highlighted field 63. By swiping his finger up- or downwards, the user may change to other valid values.

Below the marked time range 62, a status field 64 shows the current status for the batteries of the two hearing aids 10, 11, and a state field 65 shows the current battery state as explained with reference to FIG. 5. The user may the current state by touching the state field 65, whereby other states becomes visible and selectable.

Finally, the display view 60 includes a field 66 in which the hearing aid app communicates warnings, recommendations, and explains actions.

FIG. 6 shows one embodiment for setting the time for planned use of a set of hearing aids. In one embodiment, the personal communication device 13 automatically copies the set interval to be default interval for the following day. Hereby the set interval will be used until the hearing aid user makes an amendment. As the setting is depending on the smartphones internal clock, the setting will follow changes between summer and winter time, and changes in time zones.

In one embodiment, the use of the hearing aids 10, 11 is logged by the hearing aids 10, 11 themselves, read by the personal communication device 13 for setting the time for planned use for the next day. Furthermore, the not shown charging stand may log the time when the hearing aids 10, 11 and communicate this information to the personal communication device 13 for setting the time for planned use for the next day.

Figure 7:
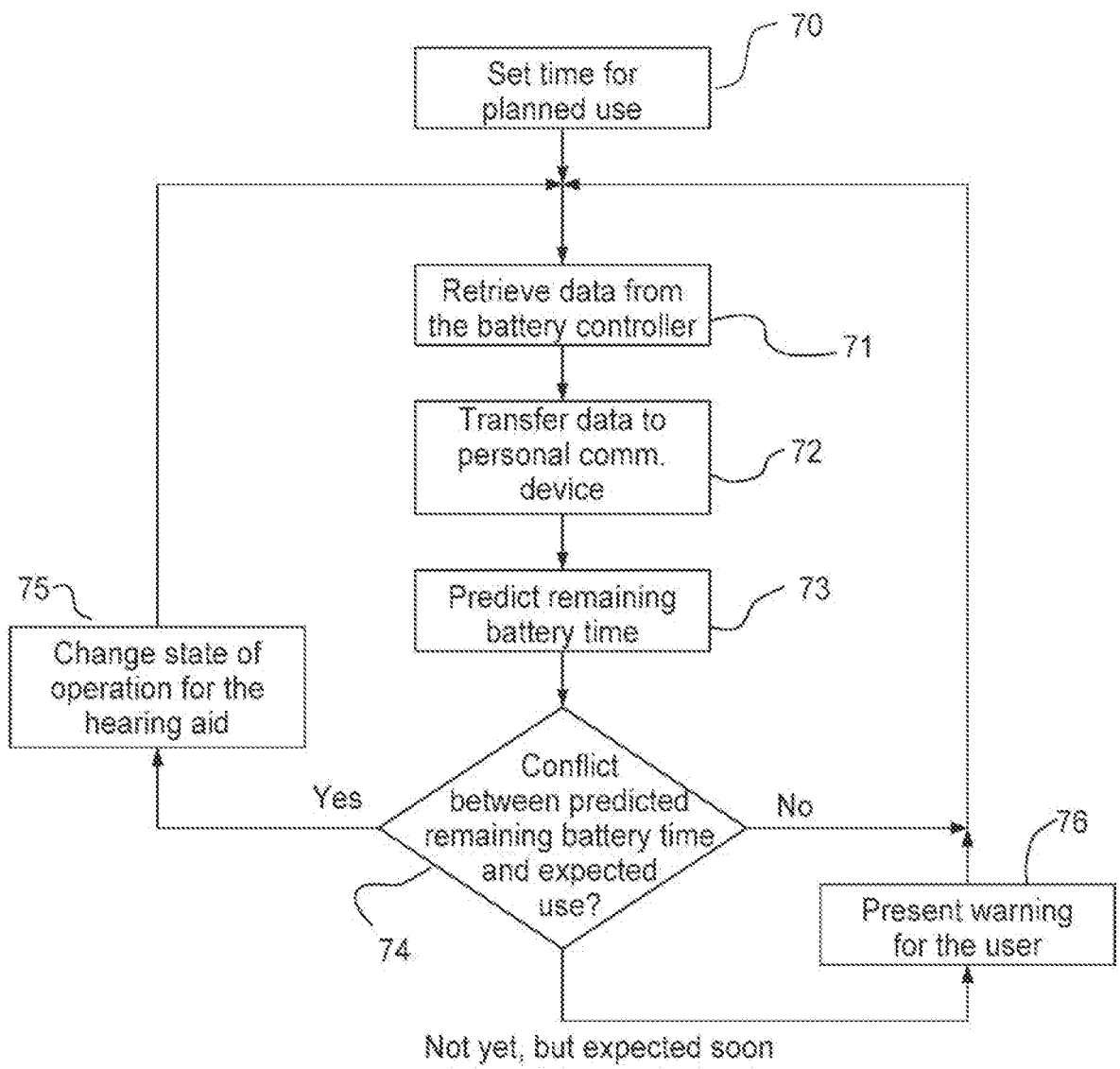
FIG. 7 illustrates a flow chart for the state selection in a hearing aid based upon battery status according to the invention.

FIG. 7 illustrates a flow chart for the state selection in a hearing aid based upon battery status according to the invention. The method according to the invention relies on a hearing aid app installed on the smartphone or the personal communication device 13 and having knowledge about the planned use, intended use or the predicted use of at least one hearing aid. The time of the planned use is entered the hearing aid app in step 70 based upon one of the methods disclosed with reference to FIG. 6.

When the hearing aids 10, 11 are fully charged, switched on by the user, the battery controller 30 starts in step 71 delivering battery status information at regular intervals. The battery status information is in step 72 transferred as control signals via the radio 44 to the personal communication device 13.

The hearing aid app is used for remote control of the hearing aids 10, 11, and according to one embodiment, the hearing aid app receives the battery status information from the hearing aids 10, 11. The hearing aid app will furthermore have access to the clock of the smartphone or the personal communication device 13. The hearing aid app also controls streaming activities between the smartphone or the personal communication device 13 and the hearing aids 10, 11.

Based on the battery status information, such as the current voltage, the voltage history and the temperature, the hearing aid app will be able to calculate the time it will take from the current battery state before the battery voltage reach the critical value 21 when the hearing aid operates in the restricted use state 52. This is done in step 73. The hearing aid app may apply an algorithm for estimating the remaining battery time like the algorithms used in computers and smartphones for calculating the remaining battery time for own batteries.

The hearing aid app also calculate the time until the user is expected to recharge his hearing aids 10, 11. In step 74, the hearing aid app compares the time calculated for the restricted use state 52 with the time required for planned use needs. If there is plenty of power for serving the hearing aid user for the planned use, the "no conflicts" route is chosen, and the hearing aids 10, 11 continues offering the entire range of services in the normal use state 51. The hearing aid apps will hereafter jump back to step 71.

If the hearing aid app concludes that there is still sufficient power, but the difference between the available time (when the hearing aid operates in the restricted use state 52) and the planned use time falls under a first threshold, the hearing aid app warns the user about a potential conflict between the predicted remaining battery time and the expected use. This takes place in step 76. In some embodiment, the threshold is fixed, but in other embodiments the threshold is a fixed percentage of the remaining planned use time. The threshold may be 25% of the planned use time. This mean that when the remaining planned use is two hours, the remaining available battery time, when the hearing aid operates in the restricted use state 52, shall be at least two hours and thirty minutes. Otherwise the warning presented in step 76 is shown in the field 66. The hearing aid apps will hereafter jump back to step 71.

If the hearing aid app concludes that a further period with high power consumption will cause that the available power not will be sufficient for powering the hearing aids for the remaining planned use period, the hearing aid app will change state of operation for the hearing aid 10, 11 in step 75. Again, the hearing aid app evaluates the difference between the available time (when the hearing aid operates in the restricted use state 52) and the planned use time. In case the difference falls under a second threshold, the hearing aid app will automatically change state of operation for the hearing aid 10, 11.

The second threshold may be fixed, but in other embodiments the threshold is a fixed percentage of the remaining planned use time. It is difficult to predict the point of time when battery reaches the critical voltage 21 and the battery controller 30 switches off the hearing aid 10, 11. Therefor the hearing aid app operates with the second threshold providing a safety margin. The threshold may be 10% of the planned use time. This mean that when the remaining planned use is two hours, the remaining available battery time, when the hearing aid operates in the restricted use state 52, shall be at least two hours and twelve minutes. Otherwise the hearing aid app changes the state of operation in step 76 by sending command signals to the hearing aid via the wireless connection 14.

In some embodiments, the hearing aid app will not automatically change state of operation for the hearing aid 10, 11, but encourage the hearing aid user to manually switch state of operation or to stop streaming. This encouragement may include text in the field 66 and/or an audio sequence presented via the speaker 43 of the hearing aid 10, 11.

In some embodiments, the restricted use state 52 will in addition to the disabling of entertainment activities also disable health monitoring activities. For health monitoring activities, PPG (Photoplethysmography) sensors are often used. PPG sensors use a light-based technology to measure the blood volume controlled by the heart's pumping action. Health monitoring sensors are in general more power consuming than basic hearing aid activities.

It shall also be noted that the remaining planned use time is the same for the two hearing aids 10, 11, while the remaining battery capacity for the two hearing aids 10, 11 may be different a indicated in the status field 64. When one of the hearing aid batteries reach a threshold as explained above, both hearing aids 10, 11 will be affected by the warning in step 76 or the change of state in step 75. The hearing aid apps will hereafter jump back to step 71.

In some embodiments, the hearing aid user may overrule the automatic change to the restricted use state by touching the state field 65 in the display view 60. Then the user is permitted to toggle between the available states, and a power consuming state is chosen, the field 66 will warn the user that the battery will not last for the entire intended use period. In one embodiment, the user may selectively activate an entertainment state, in which streaming or entertainment activities are permitted in addition to the basic hearing aid functionalities or a health monitoring state in which health monitoring activities are permitted in addition to the basic hearing aid functionalities.

By allowing the hearing aid app to access the battery controller 30 via the wireless connection 14, the hearing aid app may get access to the current battery voltages of the two hearing aids 10, 11 and monitor the discharging of the batteries. Having access to an appropriate discharging algorithm, and knowing the current consumption in the various hearing aid states, the hearing aid app will be able to do at least on of following actions:

Predict remaining battery time for the batteries in the two hearing aids 10, 11;
Automatically close streaming or entertainment activities in order to save battery power for basic hearing aid functionalities;
Automatically health monitoring activities in order to save battery power for basic hearing aid functionalities; and
Generate an alarm warning the user that he needs to save power if the current battery power shall last for a predefined period of use, e.g. until 10 o'clock in the evening.

The invention claimed is:

1. A method of operating a hearing assistive device having a rechargeable battery, and comprising
   reading battery status data from a battery controller during use of the hearing assistive device;
   transferring the battery status data wirelessly from the hearing assistive device to a computing device;
   predicting, in the computing device, a remaining battery time for the rechargeable battery based upon the battery status data received;
   comparing the remaining battery time with a predefined use pattern defining a planned use time for the hearing assistive device; and
   notifying a user when a conflict between the remaining battery time and the predefined use pattern is observed.

2. The method according to claim 1 and comprising notifying the user by an alarm warning the user that power must be saved if the remaining battery power shall last for a predefined period.

3. The method according to claim 2, wherein the predefined period is managed by means of the computing device.

4. The method according to claim 1, wherein the hearing assistive device has a restricted use state of operation in which basic hearing aid operations are carried out, and a normal use state of operation in which the hearing assistive device furthermore has enabled entertainment audio streaming from an audio streaming source, and wherein the hearing assistive device automatically switches to the restricted use state of operation when notified about the conflict between the remaining battery time and the predefined use pattern.

5. A hearing system including a computing device and at least one hearing assistive device connected via a wireless communication link,
   wherein the at least one hearing assistive device comprising:
      a battery controller adapted for controlling the charging and discharging of a rechargeable battery, and
      a processor adapted for reading battery status data from the battery controller and forwarding the read battery status data to the computing device via the wireless communication link;
   wherein the computing device comprising a hearing aid application adapted for
      wirelessly receiving the battery status data from the at least one hearing assistive device;
      predicting a remaining battery time for the rechargeable battery based upon the battery status data;
      comparing the remaining battery time with a predefined use pattern defining a planned use time for the at least one hearing assistive device; and
      notifying a user when a conflict between the remaining battery time and the predefined use pattern is observed.

6. The hearing system according to claim 5, wherein the computing device comprises a display in which the hearing aid application displays a measure for the remaining battery time.

7. The hearing system according to claim 5, wherein the computing device is adapted for handling audio streaming to the at least one hearing assistive device via the wireless communication link, and wherein the hearing aid application is adapted to automatically close entertainment activities in order to save battery power for utility activities.

8. The hearing system according to claim 5, wherein the hearing aid application is adapted to provide a user interface on a display of the computing device for the user to enter a period of intended use for the at least one hearing assistive device, and wherein the hearing aid application is adapted to generate an alarm warning to the user to save power when the current battery consumption will prohibit the battery to last for the period of intended use without recharging.

9. The hearing system according to claim 5, wherein the hearing aid application based on the battery status data received from the battery controller deems that the rechargeable battery will have difficulties in fulfilling the requirements for the anticipated use, the hearing aid application forces the at least one hearing assistive device into a restricted use state offering only basic hearing aid functionality.

10. The hearing system according to claim 9, wherein the hearing aid application, in the restricted use state for the at least one hearing assistive device, is adapted for disabling entertainment audio streaming, including music, audio track from videoclips, and podcasts.

11. The hearing system according to claim 9, wherein the hearing aid application, in the restricted use state for the at least one hearing assistive device, is adapted for disabling health monitoring employing monitoring sensors, including physiologic sensors.

12. The hearing system according to claim 9, wherein the hearing aid application, in the restricted use state for the at least one hearing assistive device, is adapted for permitting:
   basic hearing aid functionality wherein the at least one hearing assistive device reproduces environment sound being amplified and conditioned for the user; and
remote control functionality, wherein the personal communication device acts as remote control for the at least one hearing assistive device based on exchanged of control signals via the wireless connections.

13. The hearing system according to claim 9, wherein the hearing aid application is adapted to permitting the user to force the at least one hearing assistive device to re-enter a normal use state.

14. The hearing system according to claim 13, wherein the hearing aid application is adapted to generate an alarm warning warning the user that higher power consumption may shorten remaining battery time to not fulfill planned use.

* * * * *